Oct. 16, 1962 J. W. ENGLISH ET AL 3,059,157

SEMICONDUCTOR RECTIFIER

Filed Nov. 14, 1958

INVENTORS
James William English &
Charles B. Irwin, Jr.
BY Stevens, Davis, Miller & Mosher
ATTORNEYS United States Patent Office 3,059,157

Patented Oct. 16, 1962

3,059,157

SEMICONDUCTOR RECTIFIER

James William English and Charles B. Irwin, Jr., Dallas, Tex., assignors to Texas Instruments Incorporated, Dallas, Tex., a corporation of Delaware Filed Nov. 14, 1958, Ser. No. 774,028
5 Claims. (Cl. 317—234)

Figures 1, 2:
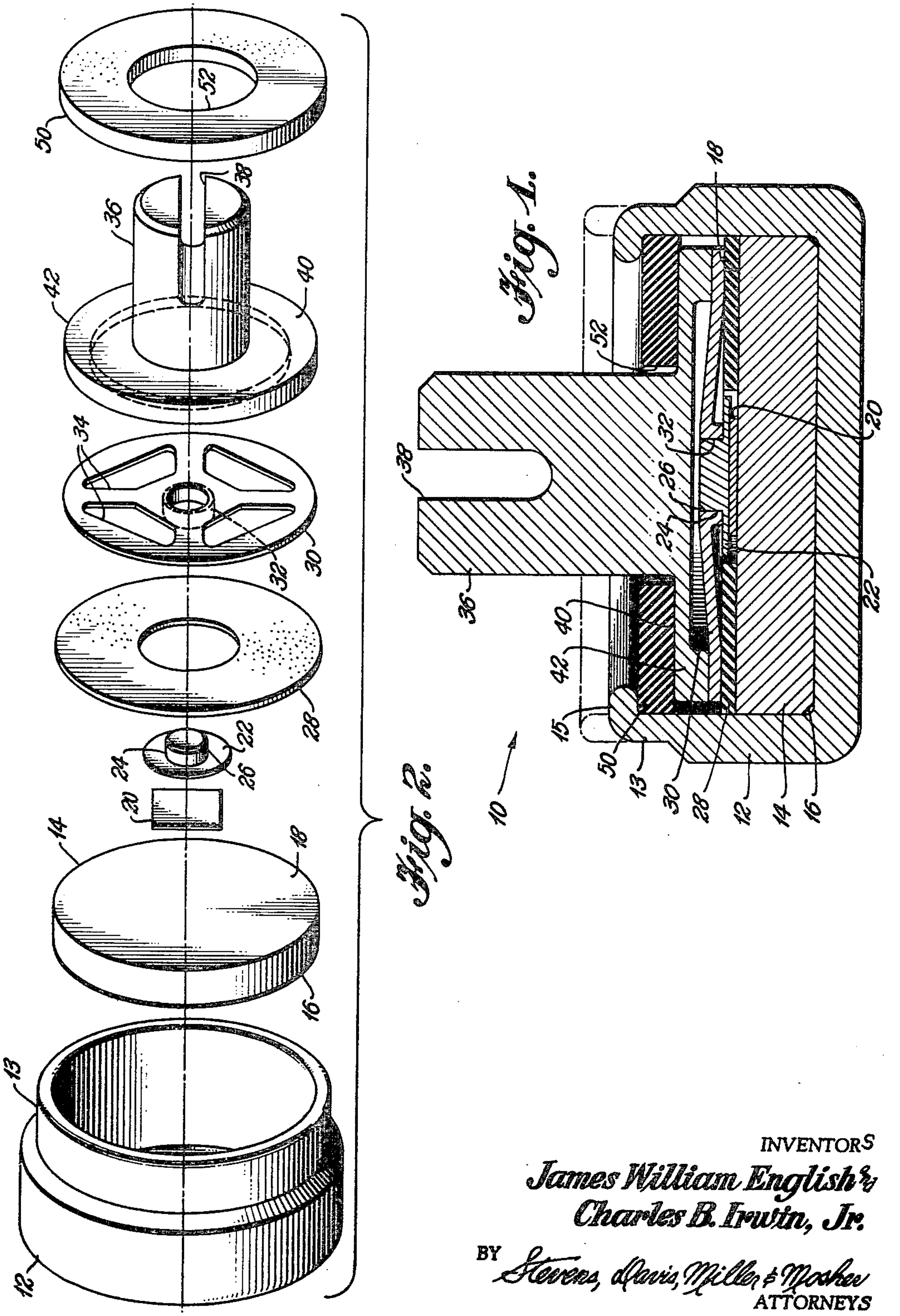

This invention relates to semiconductor devices and particularly to silicon semiconductor rectifiers of the P-N junction type which are specially adapted for power purposes.

When alternating current is applied to one side of a P-N junction silicon semiconductor, rectification takes place since the junction has low impedance to current flow from the P-type to the N-type area, but very high impedance from the N-type to the P-type area of the silicon wafer. A very high current rectification can be obtained with silicon semiconductors. The high current flow, however, generates considerable heat. It is important to dissipate such heat from the silicon wafer since the efficiency of the rectifier is rapidly degraded once the temperature of the semiconductor exceeds about 220° C.

It is an important object of this invention to provide a semiconductor rectifier assembly incorporating an adequate heat sink to quickly remove the heat from the semiconductor wafer.

Another object of the invention is to encapsulate the rectifier in a low cost easily assembled metal housing which will aid in conducting and radiating heat from the semiconductor as well as act as one of the terminals of the rectifier assembly.

Yet another object of the invention is to provide a rectifier assembly of the character indicated in which the second rectifier terminal lead is positioned centrally in an opening in the metal casing and insulated from the casing.

A further, and perhaps primary, object of the invention is to provide a rectifier, of the character indicated, in which the second terminal lead is connected to one side of the semiconductor wafer through the intermediary of a spring contact so constructed and arranged as to adequately conduct heat and current from the semiconductor while preventing shock, vibration, and other mechanical stresses in or between the lead and the casing from damaging the wafer.

A still further object of the invention is to provide a rectifier assembly, of the type indicated, wherein the spring contact is a flexible disc having a non-resilient collar which engages a contact soldered to the semiconductor wafer for the conduction of heat and current from the wafer, the disc serving to compensate for different temperature expansion coefficients of the rectifier parts as well as to maintain good electrical contact without transmission of physical shocks to the collar.

The novel features that are considered characteristic of the invention are set forth with particularity in the appended claims. The invention itself, however, both as to its organization and its method of operation, together with additional objects and advantages thereof, will best be understood from the following description of a specific embodiment when read in connection with the accompanying drawing, wherein like reference characters indicate like parts throughout the several figures and in which:

FIG. 1 is an enlarged section taken on an axial plane of a cylindrical rectifier assembly constructed according to the invention; and FIG. 2 is an exploded, perspective view of the parts forming the rectifier shown in FIG. 1.

Referring to the drawings, the reference numeral 10 is generally applied to a rectifier assembly whose parts are enclosed in a metal, tubular casing 12 closed at one end and having its open end 13, of smaller section, spun in a bead 15 over the outermost element 50 to provide a tight seal. The casing end 13 before spinning is illustrated in broken lines in FIG. 1. Casing 12 may be formed of copper, aluminum or other suitable material capable of conducting heat and current. The parts assembled within casing 12 include a semiconductor wafer 20, preferably of silicon, having a P-N junction. A copper slug 14, acting as a heat sink and contact, is seated in the closed end of casing 12. The upper surface 18 of slug 14 is soldered to one side of wafer 20 which is carefully placed centrally thereof. The bottom edge of heat sink 14 is beveled at 16 to permit ready insertion of the heat sink into the casing. A cap contact 22 is soldered to the other face of the wafer 20. Before the soldering operations, the edges of the wafer 20 are cleaned, dried and varnished for protection. The disc-like cap contact 22 is formed with an upstanding cylindrical projection 24 having a beveled upper edge 26. The heat sink 14 closely fits in casing 12 so that good contact is made between its circumferential edge and bottom face and the inner surfaces of the casing in order to provide good heat and electrical conduction. A washer 28 surmounts slug 14 and surrounds the wafer 20 and contact 22 in spaced relation thereto. This washer may be formed of mica, fiber glass or other suitable insulating material.

A spring contact 30 is seated on contact 22. The contact 30 is preferably made of brass of spring temper, and is formed in the shape of a disc with spaced cut-outs 34 to increase its resiliency. A non-resilient collar 32 depends from the central portion of the spring contact, and receives the cylindrical projection 24 of the cap contact 22 in wiping engagement. The lower edge of collar 32 engages the top surface of cap contact 22.

Seated on the spring contact 30 is the down-turned rim 42 of a metal disc 40 which flexes the spring contact downwardly as illustrated in FIG. 1. Integral with and centrally of part 40 is a cylindrical extension or terminal lead 36 which protrudes from the top of casing 12. The lead 36 has a slot 38 in which a circuit conductor may be solder connected. A second insulating washer 50, similar to washer 28 but preferably thicker, rests on the part 40 and electrically insulates the lead 36, which passes through washer opening 52, from the casing 12. The metal casing 12 acts as the second terminal or lead of the rectifier assembly.

The described elements of the rectifier assembly are easily assembled during manufacture. The wafer 20 is first soldered to the cap connector 22 and to the heat sink 14, and these parts are dropped or forced into the casing 12. The washer 28, the spring contact 30, whose collar 32 mates with the cap contact projection 24, the terminal lead 36, and the insulating washer 50 are then assembled in that order before the edge 15 of the casing is finally spun over the washer 50.

During operation of the rectifier assembly, excellent conduction of heat is obtained from both faces of the semiconductor wafer 20. The metal slug 14 provides a very adequate reservoir for a large quantity of heat generated in the wafer. The heat conducted through the cap contact 22 passes to the lead member 40, through the spring disc 30, and thence to extension 36 where it is dissipated by radiation, convection and possibly by conduction. Since the sink, over a large part of its surface area, is in contact with the walls of the metal casing, heat will be conducted from the sink to the casing and ultimately passed from the casing outer surface to the surrounding cooler environment.

The electrical paths in the rectifier closely follow those for heat conduction. One path is from terminal lead 36 through integral parts 40 and 42 to spring contact 30. The path then extends from collar 32 to the projection 24 which is integral with disc 22 soldered to one face of the semiconductor wafer. The other face of the wafer is provided with a current path through slug 14 to the casing 12 acting as the second terminal lead.

The spring contact 30 serves to preserve good heat and electrical conduction paths for the life of the rectifier under severe conditions of shock, vibration, and temperature changes which may cause differential expansion of the rectifier assembly elements. Such temperature-induced dimensional variations are compensated for by the flexure of the disc portion of contact 30. Mechanical stress between member 36 and the casing 12 is prevented from passing to the surface of the semiconductor wafer because of the shape of spring contact 30 which applies all mechanical stresses through its rim rather than its center where the electrical and physical contact of the wafer is made. The wafer is, in effect, cradled in the center of the assembly in such manner that shock and vibration are absorbed by the rim portions of elements 50, 40, 30, and 28.

Although a certain specific embodiment of the invention has been shown and described, it is obvious that many modifications thereof are possible. The invention, therefore, is not to be restricted except insofar as is necessitated by the prior art and by the spirit of the appended claims.

What is claimed is:

1. A high power rectifier assembly comprising a semiconductor wafer soldered to and between opposed surfaces of a heat sink slug and a metal contact, a tubular metal casing fitted about said slug with a closed end abutting the other slug surface, a disc shaped spring contact having a central dependent collar engaging the other surface of said metal contact, an insulating washer surrounding but spaced from said wafer and positioned between said spring contact and slug, a lead member having an outwardly offset rim disposed in said casing and abutting said spring contact to flex it against said washer, a second insulating washer overlying the rim of said lead member, the open end of said casing being spun over said second washer to press the lead member against said spring contact and seal the assembly.

2. A high power rectifier assembly according to claim 1 wherein said spring contact is provided with cutouts to increase its resiliency.

3. A rectifier assembly according to claim 1 wherein said central dependent collar of the spring contact receives an integral cylindrical projection on said metal contact in wiping engagement.

4. A semiconductor assembly comprising a semiconductor wafer sandwiched between a heat sink slug and a metal contact, said slug and said contact maintaining intimate engagement with said wafer over major portions of the surfaces thereof, a casing enclosing said slug, wafer and contact and forming one electrical lead for the assembly, a second lead entering said casing and insulated therefrom, and means for thermally and electrically connecting said second lead to said metal contact, said means including an intermediate spring contact.

5. A semiconductor assembly comprising a semiconductor wafer sandwiched between a heat sink slug and a metal contact, a casing enclosing said slug, wafer and contact and forming one electrical lead for the assembly, a second lead entering said casing and insulated therefrom, and means for electrically connecting said second lead to said metal contact, said means including an intermediate spring contact having a central, non-resilient portion in conductive engagement with said metal contact and a rim portion in resilient engagement with said second lead, whereby the semi-conductor is protected from mechanical stresses, shock and vibration.

References Cited in the file of this patent

UNITED STATES PATENTS

| | | |
|---|---|---|
| 2,545,863 | Sell et al. | Mar. 20, 1951 |
| 2,712,619 | Zetwo | July 5, 1955 |
| 2,817,797 | Coyle | Dec. 24, 1957 |
| 2,956,214 | Herbst | Oct. 11, 1960 |
| 2,958,020 | Eannarino | Oct. 25, 1960 |
| 2,993,153 | Wagner | July 18, 1961 |